(12) United States Patent
Chen et al.

(10) Patent No.: US 9,328,409 B2
(45) Date of Patent: May 3, 2016

(54) COATED ARTICLE, METHOD FOR MAKING THE SAME AND ELECTRONIC DEVICE USING THE SAME

(71) Applicant: HON HAI PRECISION INDUSTRY CO., LTD., New Taipei (TW)

(72) Inventors: Ga-Lane Chen, Santa Clara, CA (US); Chao-Tsang Wei, New Taipei (TW); Shih-Che Chien, New Taipei (TW); Ming-Yang Liao, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/699,649

(22) Filed: Apr. 29, 2015

(65) Prior Publication Data

US 2016/0090646 A1 Mar. 31, 2016

(30) Foreign Application Priority Data

Sep. 30, 2014 (TW) ............................. 103133864 A

(51) Int. Cl.
*B32B 15/04* (2006.01)
*B32B 17/06* (2006.01)
*C23C 14/34* (2006.01)
*C23C 14/08* (2006.01)

(52) U.S. Cl.
CPC .................. *C23C 14/34* (2013.01); *C23C 14/08* (2013.01); *C23C 14/081* (2013.01)

(58) Field of Classification Search
USPC ......... 428/426, 428, 432, 688, 689, 697, 699, 428/701, 702
See application file for complete search history.

(56) References Cited

U.S. PATENT DOCUMENTS

| | | | | |
|---|---|---|---|---|
| 2002/0114945 A1* | 8/2002 | Greenberg | ............ | C03C 17/245 428/336 |
| 2004/0258928 A1* | 12/2004 | Arbab | ...................... | C03C 17/36 428/434 |
| 2007/0275253 A1* | 11/2007 | Thiel | ....................... | B32B 17/06 428/432 |
| 2009/0142602 A1* | 6/2009 | Medwick | ................ | C03C 17/36 428/428 |
| 2012/0027968 A1* | 2/2012 | Chang | .................. | C23C 14/0036 428/34.1 |
| 2012/0077024 A1* | 3/2012 | Chang | .................. | H05K 9/0084 428/332 |
| 2014/0090864 A1* | 4/2014 | Paulson | ................ | C03C 17/225 174/50 |
| 2014/0141221 A1* | 5/2014 | Storey | ...................... | B05D 1/62 428/216 |

FOREIGN PATENT DOCUMENTS

WO    WO2014/078497    *    5/2014

OTHER PUBLICATIONS http://accuratus.com/zirc.html, 2013.*
Surface Engineering for Corrosion and Wear Resistance (J.R.Davis, ASM International, 2001).*
Handbook of Thermal Spray Technology (Joseph R. Davis ASM International, Jan. 1, 2004).*

* cited by examiner

*Primary Examiner* — Lauren R Colgan
(74) *Attorney, Agent, or Firm* — Novak Druce Connolly Bove + Quigg LLP

(57) ABSTRACT

A coated article includes a glass substrate and a film on at least one surface of the glass substrate. The film includes $Al_2O_3$, $Cr_2O_3$ and $ZrO_2$. A method for making the coated article, and an electronic device using the coated article are also provided.

14 Claims, 4 Drawing Sheets

COATED ARTICLE, METHOD FOR MAKING THE SAME AND ELECTRONIC DEVICE USING THE SAME

FIELD

The subject matter generally relates to a coated article, a method for making the coated article, and an electronic device using the coated article.

BACKGROUND

Glass has excellent transparence, and is widely used in many applications. However, the wear resistance of the glass is poor.

BRIEF DESCRIPTION OF THE DRAWINGS

Implementations of the present technology will now be described, by way of example only, with reference to the attached figures.

DETAILED DESCRIPTION

Figure 1:
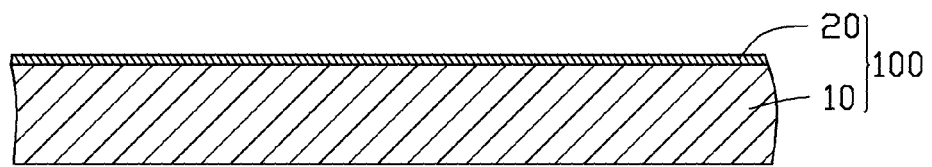
FIG. 1 is a cross-sectional view of an exemplary coated article.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

The term "comprising," when utilized, means "including, but not necessarily limited to"; it specifically indicates open-ended inclusion or membership in the so-described combination, group, series, and the like.

FIG. 1 illustrates a coated article 100 according to an exemplary embodiment. The coated article 100 includes a glass substrate 10 and a film 20 on at least one surface of the glass substrate 10. The film 20 contains alumina ($Al_2O_3$), chromium oxide ($Cr_2O_3$), and zirconium oxide ($ZrO_2$).

The $Al_2O_3$ in the film 20 can increase hardness and wear resistance of the film 20. The $Cr_2O_3$ in the film 20 can increase adhesion of the film 20 to the glass substrate 10, and improve flexibility of the film 20. The $ZrO_2$ in the film 20 can improve flexibility of the film 20.

The film 20 has a thickness of about 1 μm to about 4 μm. In the film 20, the $Al_2O_3$ has a mass percentage of about 94% to about 96%, the $Cr_2O_3$ has a mass percentage of about 1.7% to about 3.8%, and the $ZrO_2$ has a mass percentage of about 0.8% to about 2.3%.

Figure 2:
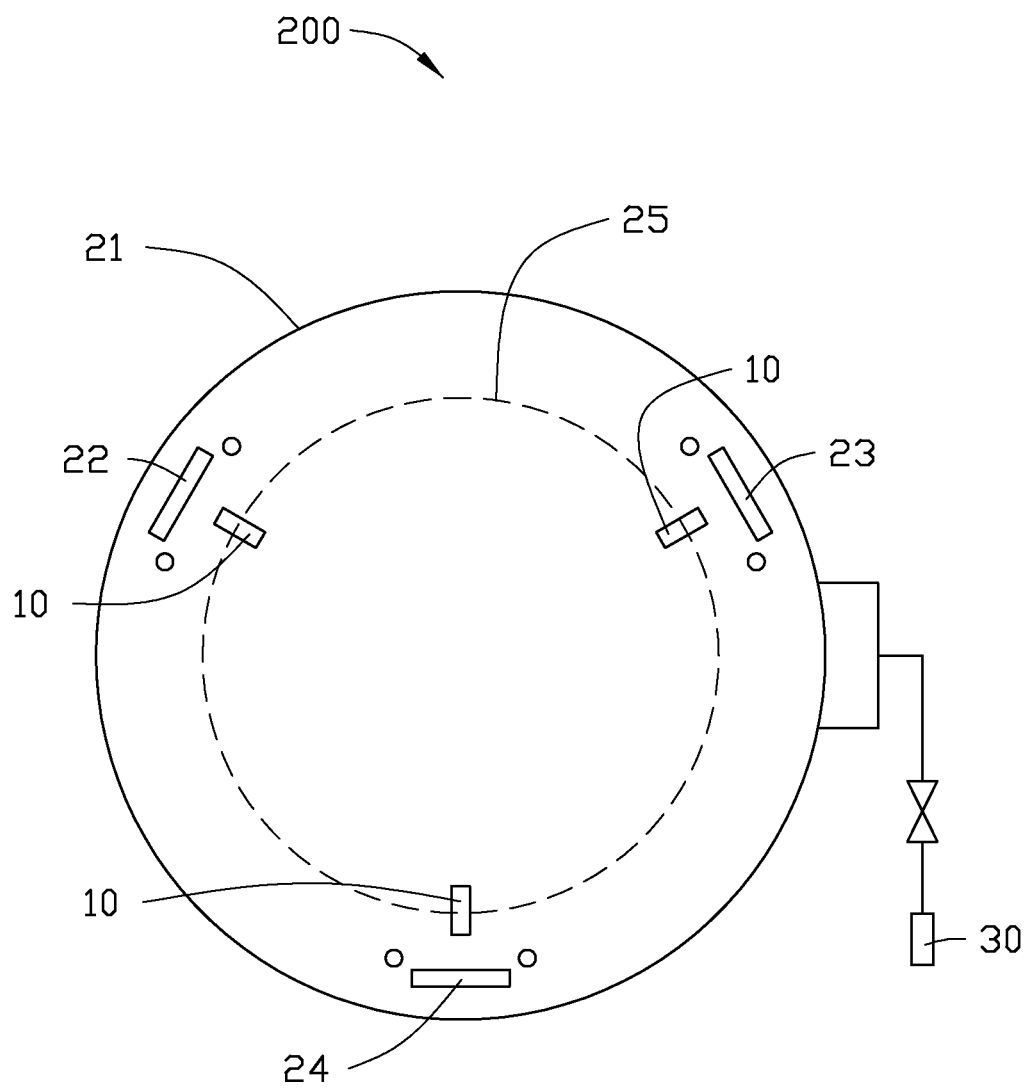
FIG. 2 is a top view of a vacuum sputtering device for forming the coated article in FIG. 1.

FIG. 2 illustrates a vacuum sputtering device 200, which includes a vacuum chamber 21 and a vacuum pump 30 connected to the vacuum chamber 21. The vacuum pump 30 is used to evacuate the vacuum chamber 21. The vacuum chamber 21 has a rotary rack (not shown), an aluminum target 22, a chromium target 23, and a zirconium target 24 positioned therein. The rotary rack is configured for holding the glass substrate 10 to revolve along a circular path 25, and the glass substrate 10 can also rotate around its own axis while being carried by the rotary rock.

Figure 3:
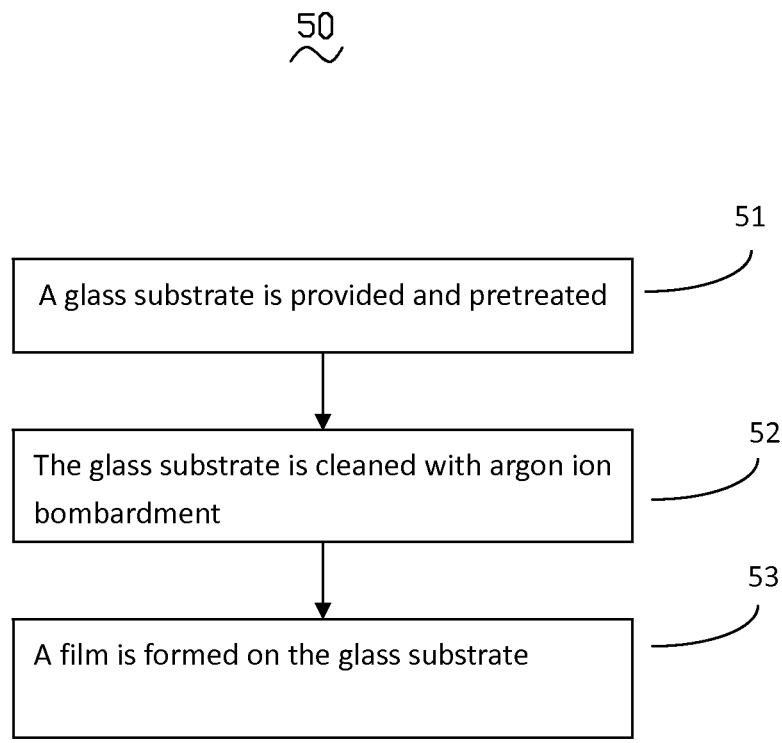
FIG. 3 is a flow chart of forming the coated article.

Referring to FIG. 3, a flowchart is presented in accordance with an example embodiment of a method for making the coated article 100 which may include the following steps. The example method 50 is provided by way of example, as there are a variety of ways to carry out the method. The method 50 described below can be carried out using the configurations illustrated in FIG. 3, for example, and various elements of the figure are referenced in explaining example method 50. Each block shown in FIG. 3 represents one or more processes, methods or subroutines, carried out in the example method 50.

At block 51, a glass substrate 10 is provided and pretreated. The pre-treating process can include cleaning the surface of the glass substrate 10 with alcohol and deionized water, respectively. The pre-treating process can remove impurities such as grease or dirt from the glass substrate 10. Then the glass substrate 10 is dried.

At block 52, the glass substrate 10 is cleaned by argon ion bombardment. A negative bias voltage of about 100 V to about 200 V is applied on the glass substrate 10. Argon gas (Ar) is used as the sputtering gas and is fed into the vacuum chamber 21. The glass substrate 10 is cleaned for about 3 min to about 5 min. Argon ion bombardment can further clean the surfaces of the glass substrate 10 and increase the surface adhesion to substance of the glass substrate 10. In other embodiments, this block can be omitted.

At block 53, the film 20 is formed on the glass substrate 10 by vacuum sputtering. Vacuum sputtering of the film 20 is carried out in the vacuum chamber 21. The vacuum chamber 21 is heated to have an interior temperature of about 150° C. to about 250° C. The aluminum target 22, the chromium target 23, and the zirconium target 24 are started at the same time. The aluminum target 22 is applied with an electrical power of about 5 KW to about 15 KW, the chromium target 23 is applied with an electrical power of about 0.5 KW to about 5 KW, and the zirconium target 24 is applied with an electrical power of about 0.5 KW to about 5 KW. Oxygen gas ($O_2$) is used as a reaction gas and is fed into the vacuum chamber 21 at a flow rate of about 100 standard-state cubic centimeters (sccm) to about 400 sccm. Argon gas is used as the sputtering gas and is fed into the vacuum chamber 21 at a flow rate of about 50 sccm to about 130 sccm. A negative bias voltage of about 0 V to about 300 V (0 V means no negative bias voltage) is applied to the glass substrate 10. Deposition of the film 20 takes about 120 min to about 960 min.

The method can further includes cleaning the targets before vacuum sputtering of the film 20.

The vacuum pump 30 is started, and the vacuum chamber 21 is evacuated to about $1.067 \times 10^{-2}$ Pa to about $4 \times 10^{-2}$ Pa (another representation is $8 \times 10^{-5}$ Torr to about $3 \times 10^{-4}$ Torr). Argon gas (Ar) is used as the sputtering gas and is fed into the vacuum chamber 21 at a flow rate of about 100 sccm to about 300 sccm. An electrical power of about 5 KW to about 10 KW is applied to each target. The cleaning of the targets takes about 3 min to about 5 min. As such, the impurities (such as oxides and grease) on the surface of the targets can be removed.

Figure 4:
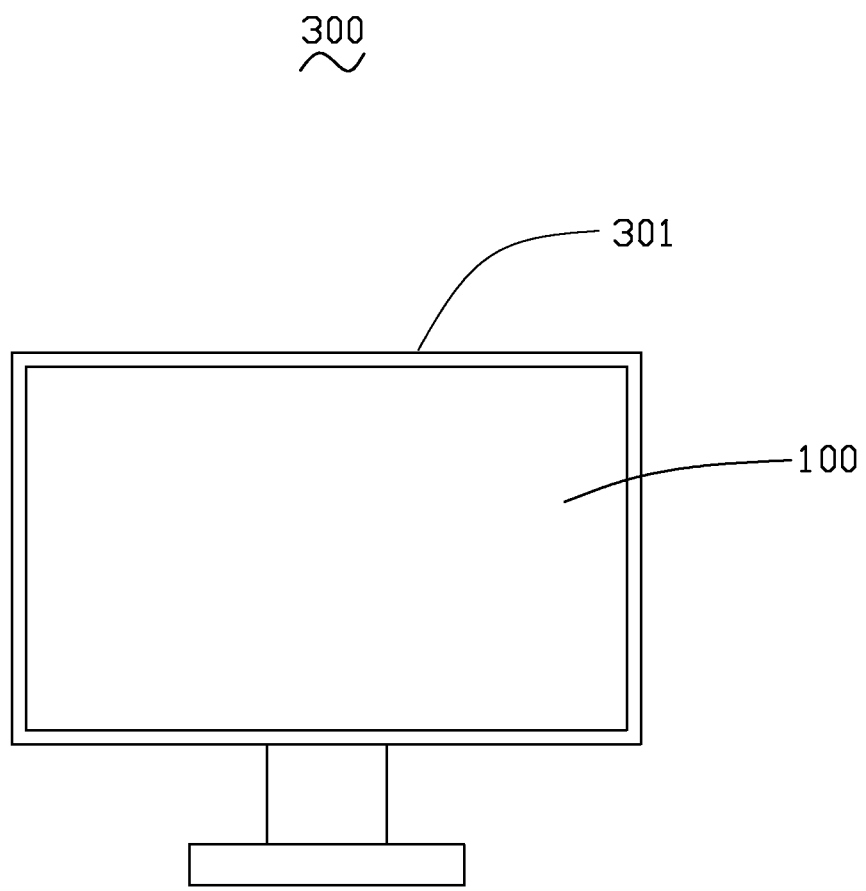
FIG. 4 is a diagrammatic view of an electronic device using the coated article of FIG. 1.

FIG. 4 illustrates an electronic device 300 using the coated article 100. The electronic device 300 includes a main body 301, the coated article 100 is installed on the main body 301 as a housing. The electronic device 300 can be a computer, a telephone, a watch, a television, an electronic reader, or a camera which uses transparent glass. In this embodiment, the electronic device 300 is a computer.

EXAMPLE 1

The glass substrate 10 was made of transparent glass. The pre-treating process included cleaning the surface of the glass substrate 10 with alcohol and deionized water, respectively. Then the glass substrate 10 was dried.

The targets were cleaned. The vacuum chamber 21 was evacuated to $1.331 \times 10^{-2}$ Pa ($1 \times 10^{-4}$ Torr) by the vacuum pump 30. Ar was fed into the vacuum chamber 21 at a flow rate of about 200 sccm, each target was applied with an electrical power of about 8 KW. The cleaning lasted 4 min.

The vacuum chamber 21 was evacuated to $1.331 \times 10^{-2}$ Pa ($1 \times 10^{-4}$ Torr) by the vacuum pump 30. The glass substrate 10 was cleaned by argon ion bombardment. The vacuum chamber 21 was heated to have an interior temperature of 200° C. A negative bias voltage of 150 V was applied on the glass substrate 10. Ar was fed into the vacuum chamber 21. The glass substrate 10 was cleaned for 4 min.

The film 20 was formed on the glass substrate 10 by vacuum sputtering. The vacuum chamber 21 was heated to have an interior temperature of 250° C. The aluminum target 22 was applied with an electrical power of 15 KW, the chromium target 23 was applied with an electrical power of 3 KW, the zirconium target 24 was applied with an electrical power of 2 KW. $O_2$ was fed into the vacuum chamber 21 at a flow rate of 300 sccm. Ar was fed into the vacuum chamber 21 at a flow rate of 60 sccm. In this example, no negative bias voltage was applied on the glass substrate 10. Deposition of the film 20 lasted 480 min.

The thickness of the film 20 was 2.01 μm. In the film 20, the $Al_2O_3$ had a mass percentage of 94.33%, the $Cr_2O_3$ had a mass percentage of 3.53%, and the $ZrO_2$ had a mass percentage of 2.14%.

EXAMPLE 2

The glass substrate 10 was made of transparent glass. The pre-treating process included cleaning the surface of the glass substrate 10 with alcohol and deionized water, respectively. Then the glass substrate 10 was dried.

The targets were cleaned. The vacuum chamber 21 was evacuated to $4 \times 10^{-2}$ Pa ($3 \times 10^{-4}$ Torr) by the vacuum pump 30. Ar was fed into the vacuum chamber 21 at a flow rate of about 100 sccm, each target was applied with an electrical power of about 5 KW. The cleaning lasted 3 min.

The vacuum chamber 21 was evacuated to $4 \times 10^{-2}$ Pa ($3 \times 10^{-4}$ Torr) by the vacuum pump 30. The glass substrate 10 was cleaned by argon ion bombardment. The vacuum chamber 21 was heated to have an interior temperature of 150° C. A negative bias voltage of 100 V was applied on the glass substrate 10. Ar was fed into the vacuum chamber 21. The glass substrate 10 was cleaned for 3 min.

The film 20 was formed on the glass substrate 10 by vacuum sputtering. The vacuum chamber 21 was heated to have an interior temperature of 150° C. The aluminum target 22 was applied with an electrical power of 10 KW, the chromium target 23 was applied with an electrical power of 2.25 KW, the zirconium target 24 was applied with an electrical power of 0.75 KW. $O_2$ was fed into the vacuum chamber 21 at a flow rate of 200 sccm. Ar was fed into the vacuum chamber 21 at a flow rate of 80 sccm. In this example, no negative bias voltage was applied on the glass substrate 10. Deposition of the film 20 lasted 240 min.

The thickness of the film 20 was 1.2 μm. In the film 20, the $Al_2O_3$ had a mass percentage of 94%, the $Cr_2O_3$ had a mass percentage of 3.8%, and the $ZrO_2$ had a mass percentage of 2.2%.

EXAMPLE 3

The glass substrate 10 was made of transparent glass. The pre-treating process included cleaning the surface of the glass substrate 10 with alcohol and deionized water, respectively. Then the glass substrate 10 was dried.

The targets were cleaned. The vacuum chamber 21 was evacuated to $1.067 \times 10^{-2}$ Pa ($8 \times 10^{-5}$ Torr) by the vacuum pump 30. Ar was fed into the vacuum chamber 21 at a flow rate of about 300 sccm, each target was applied with an electrical power of about 10 KW. The cleaning lasted 5 min.

The vacuum chamber 21 was evacuated to $1.067 \times 10^{-2}$ Pa ($8 \times 10^{-5}$ Torr) by the vacuum pump 30. The glass substrate 10 was cleaned by argon ion bombardment. The vacuum chamber 21 was heated to have an interior temperature of 250° C. A negative bias voltage of 200 V was applied on the glass substrate 10. Ar was fed into the vacuum chamber 21. The glass substrate 10 was cleaned for 5 min.

The film 20 was formed on the glass substrate 10 by vacuum sputtering. The vacuum chamber 21 was heated to have an interior temperature of 250° C. The aluminum target 22 was applied with an electrical power of 20 KW, the chromium target 23 was applied with an electrical power of 3.75 KW, the zirconium target 24 was applied with an electrical power of 1.25 KW. $O_2$ was fed into the vacuum chamber 21 at a flow rate of 300 sccm. Ar was fed into the vacuum chamber 21 at a flow rate of 50 sccm. In this example, no negative bias voltage was applied on the glass substrate 10. Deposition of the film 20 lasted 960 min.

The thickness of the film 20 was 3.98 μm. In the film 20, the $Al_2O_3$ had a mass percentage of 95.7%, the $Cr_2O_3$ had a mass percentage of 2.5%, and the $ZrO_2$ had a mass percentage of 1.8%.

The embodiments shown and described above are only examples. Even though numerous characteristics and advantages of the present technology have been set forth in the foregoing description, together with details of the structure and function of the present disclosure, the disclosure is illustrative only, and changes can be made in the detail, including in matters of shape, size and arrangement of the parts within the principles of the present disclosure up to, and including, the full extent established by the broad general meaning of the terms used in the claims.

What is claimed is:

1. A coated article comprising:
   a glass substrate; and
   a film formed on at least one surface of the glass substrate;
   wherein the film comprises $Al_2O_3$, $Cr_2O_3$ and $ZrO_2$, the $Al_2O_3$ has a mass percentage of about 94% to about 96%, the $Cr_2O_3$ has a mass percentage of about 1.7% to about 3.8% to increase adhesion of the film to the glass substrate and improve flexibility of the film, the $ZrO_2$ has a mass percentage of about 0.8% to about 2.3% to improve flexibility of the film.

2. The coated article as claimed in claim 1, wherein the thickness of the film is about 1 μm to about 4 μm.

3. An electronic device comprising:
a coated article, comprising:
a glass substrate; and
a film formed on at least one surface of the glass subatrate; wherein the film comprises $Al_2O_3$, $Cr_2O_3$ and $ZrO_2$ the $Al_2O_3$ has a mass percentage of about 94% to about 96%, the $Cr_2O_3$ has a mass percentage of about 1.7% to about 3.8% to increase adhesion of the film to the glass substrate and improve flexibility of the film, the $ZrO_2$ has a mass percentage of about 0.8% to about 2.3% to improve flexibility of the film.

4. The electronic device as claimed in claim 3, wherein the thickness of the film is about 1 μm to about 4 μm.

5. A method for making a coated article comprising:
providing a glass substrate;
forming a film on at least one surface of the glass substrate by vacuum sputtering method, the film comprising $Al_2O_3$, $Cr_2O_3$ and $ZrO_2$, the $Al_2O_3$ has a mass percentage of about 94% to about 96%, the $Cr_2O_3$ has a mass percentage of about 1.7% to about 3.8% to increase adhesion of the film to the glass substrate and improve flexibility of the film, the $ZrO_2$ has a mass percentage of about 0.8% to about 2.3% to improve flexibility of the film, the method using an aluminum target, a chromium target, and a zirconium target as targets, and $O_2$ as reaction gas.

6. The method as claimed in claim 5, wherein vacuum sputtering of the film is carried out at a temperature of about 150° C. to about 250° C., the $O_2$ gas has a flow rate of about 100 sccm to about 400 sccm; the aluminum target is applied with an electrical power of about 5 KW to about 15 KW, the chromium target is applied with an electrical power of about 0.5 KW to about 5 KW, the zirconium target is applied with an electrical power of about 0.5 KW to about 5 KW; a negative bias voltage of about 0 V to about 300 V is applied on the glass substrate.

7. The method as claimed in claim 6, wherein vacuum sputtering the film lasts about 120 min to about 960 min.

8. The method as claimed in claim 5, wherein the film has a thickness of about 1 μm to about 4 μm.

9. The method as claimed in claim 5, wherein the method further comprises cleaning the targets before vacuum sputtering the film.

10. The method as claimed in claim 9, wherein cleaning the targets uses Ar and the Ar has a flow rate of about 100 sccm to about 300 sccm, and each target is applied with an electrical power of about 5 KW to about 10 KW.

11. The method as claimed in claim 10, wherein cleaning the targets lasts about 3 min to about 5 min.

12. The method as claimed in claim 5, wherein the method further comprises cleaning the glass substrate by argon ion bombardment before vacuum sputtering the film.

13. The method as claimed in claim 12, wherein cleaning the glass substrate uses Ar; the glass substrate is applied with an electrical power of about 100 V to about 200 V.

14. The method as claimed in claim 12, wherein cleaning the glass substrate lasts about 3 min to about 5 min.

* * * * *